Oct. 5, 1954 E. H. HUGENHOLTZ 2,691,139
CIRCUIT ARRANGEMENT FOR PHASE OR FREQUENCY MODULATED OSCILLATIONS
Original Filed Oct. 1, 1948
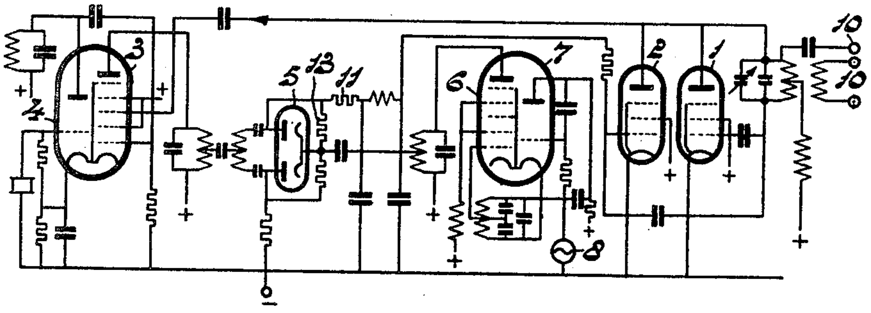
INVENTOR.
Edvard Herman Hugenholtz
BY Fred M Vogel
AGENT Patented Oct. 5, 1954 2,691,139

UNITED STATES PATENT OFFICE 2,691,139

CIRCUIT ARRANGEMENT FOR PHASE OR FREQUENCY MODULATED OSCILLATIONS

Eduard Herman Hugenholtz, Hilversum, Netherlands, assignor to Hartford National Bank and Trust Company, Hartford, Conn., as trustee Original application October 1, 1948, Serial No. 52,342. Divided and this application April 5, 1950, Serial No. 154,087

3 Claims. (Cl. 332—19)

This application is a division of my application Serial No. 52,342 filed October 1, 1948, now abandoned.

This invention relates to circuit arrangements for phase or frequency modulated oscillations.

A method is known to interlock two unmodulated oscillations of like frequencies generated by two oscillators, according to which the compared oscillations are combined in a phase comparison device e. g. a diode-peak detector circuit, the output of the phase comparison device being fed through D. C.-passing connections including a low-pass filter having a low cut-off frequency, to frequency-control means associated with one of the oscillators so as to interlock as regards frequency both oscillators.

The invention is based on the recognition that appropriate modifications of the concerned type of circuit arrangements lead to circuit arrangements, which may be used advantageously in phase or frequency modulation transmitters, e. g. telegraphy transmitters with frequency-shift keying.

The circuit arrangement for phase or frequency modulated oscillations according to the invention is characterized by a first high-frequency oscillator with associated frequency modulator, a lower frequency generator comprising means to phase- or frequency-modulate its output by a modulation voltage, a heterodyning stage with inputs connected to said first high frequency oscillator and a second high frequency oscillator so as to heterodyne the first high frequency downward to a frequency substantially equalling said lower frequency, a phase-comparison-device with inputs connected to the heterodyning stage output and to the modulated lower frequency generator output, the output of the phase-comparison-device being connected to the input of the frequency modulator through a D. C.-passing filter passing said modulation-voltage so as to automatically interlock as regards frequency and modulation the high frequency voltage and the phase- or frequency-modulated lower frequency voltage.

In a circuit arrangement according to the invention the interlocking of the first high frequency oscillator with the lower frequency generator and the preferably crystal-controlled second high frequency oscillator causes the central frequency of the first high frequency oscillator to show a stability determined by the stabilities of the lower frequency generator and the second high-frequency oscillator, which stability consequently may be very high, even if the output-power of the first high frequency oscillator is many times the output-power of either of the other voltage-sources.

The invention will now be explained more fully by reference to the accompanying drawing showing, by way of example, an embodiment thereof.

In the drawing, the desired frequency-modulated oscillations are generated by means of a first high frequency oscillator 1, the frequency of which is controlled by a control voltage supplied to a reactance tube 2 constituting a frequency-modulator associated with this oscillator. The oscillations generated by the oscillator 1 are mixed in a heterodyning stage 3 with oscillations generated by a crystal controlled second high frequency oscillator 4. The generated mixed oscillation, the central frequency of which is much lower than the central frequency of the oscillations generated by the oscillator 1, is supplied to a phase-comparison device 5 or so called beat discriminator with a mixing stage of conventional type, together with an oscillation of substantially like frequency generated by a lower frequency generator 6, of which the output is modulated by means of a frequency-modulator, controlled by source 8 of modulating audio voltages. The voltage generated across an output resistance 13 of the phase-comparison device, which voltage is dependent of the phase difference between the oscillations generated in the output of heterodyning stage 3 and the oscillations generated by the lower frequency generator 6, controls the frequency-modulator 2 of the first high frequency oscillator 1, thus ensuring, that the frequency of the oscillation generated by the oscillator 1 equals the sum (at reversed polarity of the control-voltage the difference) of the frequencies generated by the oscillators 4 and 6. By means of a D. C.-passing low-pass filter 11 undesired mixing frequencies are suppressed, but the time-constant of the filter must be sufficiently small so as to pass all modulation frequencies of source 8. The desired FM-modulated output may be derived from terminals 10 provided in the output circuit of the first high frequency oscillator 1.

The stages shown in the drawing are intended only as an example and may be substituted by any other stage suitable for the same purpose.

I claim:

1. In wavelength modulation apparatus, first and second sources for respectively producing first and second high-frequency signals, a third source for producing low-frequency oscillations, means to wavelength modulate said third source with an intelligence signal, a frequency corrector coupled to said first source, a mixing stage coupled to said first and second sources for heterodyning said first and second high-frequency oscillations to produce output beat oscillations whose frequency substantially equals the frequency of said low-frequency oscillations, a phase comparison device coupled to the output of said mixing stage and said third source to compare said wavelength modulated low-frequency oscillations and said heterodyned oscillations to produce a control voltage dependent on the wavelength difference therebetween, and means including a low-pass filter for direct coupling of said device with said frequency corrector to supply said control voltage to said frequency corrector whereby said first high-frequency oscillations are automatically interlocked both as to frequency and as to modulation with said wavelength modulated low-frequency oscillations.

2. Apparatus as set forth in claim 1 wherein said second source is constituted by a crystal-controlled oscillator.

3. In wavelength modulation apparatus, first and second sources for respectively producing first and second high-frequency signals, a third source for producing low-frequency oscillations, means to wavelength modulate said third source with an intelligence signal, a voltage responsive frequency corrector coupled to said first source, a mixing stage coupled to said first and second sources for heterodyning said first and second high-frequency oscillations to produce output beat oscillations whose frequency substantially equals the frequency of said low-frequency oscillations, a phase comparison device coupled to the output of said mixing stage and said third source for comparing said wavelength modulated low-frequency oscillations and said beat oscillations to produce a control voltage dependent on the wavelength difference therebetween, and means including a low-pass filter having a cut-off frequency which substantially equals the highest wavelength modulation frequency of said signal for direct coupling of said device with said frequency corrector to supply said control voltage to said frequency corrector, whereby said first high-frequency oscillations are automatically interlocked both as to frequency and as to modulation with said wavelength modulated low-frequency oscillations.

References Cited in the file of this patent

UNITED STATES PATENTS

| Number | Name | Date |
|---|---|---|
| 2,394,393 | Mayer | Feb. 5, 1946 |
| 2,400,648 | Korman | May 21, 1946 |
| 2,595,608 | Robinson et al. | May 6, 1952 |
| 2,605,425 | Hugenholtz | July 29, 1952 |